(12) United States Patent
Zhao

(10) Patent No.: US 7,602,616 B2
(45) Date of Patent: Oct. 13, 2009

(54) METHOD AND APPARATUS FOR ASSEMBLING MULTI-CORE DICE USING SOCKETS WITH MULTIPLE SETS OF FRONT SIDE BUS CONTACTS

(75) Inventor: Richard Zhao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 458 days.

(21) Appl. No.: 11/385,134

(22) Filed: Mar. 20, 2006

(65) Prior Publication Data

US 2007/0216018 A1 Sep. 20, 2007

(51) Int. Cl.
*H01R 12/16* (2006.01)
(52) U.S. Cl. .......................... 361/785; 361/780; 439/67
(58) Field of Classification Search ......... 361/780–785; 439/67–68, 331; 710/100, 300
See application file for complete search history.

(56) References Cited

U.S. PATENT DOCUMENTS

| 6,122,695 | A | * | 9/2000 | Cronin .................. 710/100 |
| 7,118,386 | B2 | * | 10/2006 | Sato et al. .................. 439/73 |
| 7,255,573 | B2 | * | 8/2007 | He et al. .................. 439/66 |
| 2002/0089833 | A1 | | 7/2002 | Patel et al. |
| 2003/0057980 | A1 | | 3/2003 | Murphy et al. |
| 2004/0102074 | A1 | | 5/2004 | Kukita et al. |
| 2007/0156971 | A1 | * | 7/2007 | Sistla et al. ............. 711/141 |

OTHER PUBLICATIONS

Wikipedia, "Socket T", http://en.wikipedia.org/wiki/Socket_T.

* cited by examiner

*Primary Examiner*—Tuan T Dinh
(74) *Attorney, Agent, or Firm*—Blakely, Sokoloff, Taylor & Zafman LLP

(57) ABSTRACT

An embodiment of the present invention is a technique to assemble multi-core dice. A first socket has first N sets of front side bus (FSB) contacts to house a first package having first 2N dice. Each of the first 2N dice has M cores. N and M are positive integers. A first chipset has 2N FSB signal groups interfacing to the first package via the first N sets of FSB contacts using first N FSB signal groups of the 2N FSB signal groups.

24 Claims, 6 Drawing Sheets

US 7,602,616 B2

METHOD AND APPARATUS FOR ASSEMBLING MULTI-CORE DICE USING SOCKETS WITH MULTIPLE SETS OF FRONT SIDE BUS CONTACTS

BACKGROUND

1. Field of the Invention

Embodiments of the invention relate to the field of semiconductor, and more specifically, to packaging.

2. Description of Related Art

Multi-core technology is a design technology in which a single physical processor contains the core logic of more than one processor. The multi-core design puts several processor cores and packages them as a single physical processor. The goal of this design is to enable a system to run more tasks simultaneously and thereby achieve greater overall system performance. Chipsets have been developed having multiple front side buses (FSBs) to provide interface to multi-core processors. Multiple-FSB chipsets provide further performance enhancement for multiprocessing systems that use multi-core processors.

The performance enhancement provided by multiple-FSB chipsets, however, is limited by the topology and design of the sockets that house the multi-core processors. Current socket design only supports a single FSB for multiprocessor systems using multi-core processors.

BRIEF DESCRIPTION OF THE DRAWINGS

Embodiments of invention may best be understood by referring to the following description and accompanying drawings that are used to illustrate embodiments of the invention. In the drawings.

DESCRIPTION

An embodiment of the present invention is a technique to assemble multi-core dice. A first socket has first N sets of front side bus (FSB) contacts to house a first package having first 2N dice. Each of the first 2N dice has M cores. N and M are positive integers. A first chipset has 2N FSB signal groups interfacing to the first package via the first N sets of FSB contacts using first N FSB signal groups of the 2N FSB signal groups.

In the following description, numerous specific details are set forth. However, it is understood that embodiments of the invention may be practiced without these specific details. In other instances, well-known circuits, structures, and techniques have not been shown to avoid obscuring the understanding of this description.

One embodiment of the invention may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc.

One embodiment of the invention is a technique to enhance performance of multi-core processors or multiprocessor systems by using a socket with multiple sets of FSB contacts. With multiple sets of FSB contacts, the socket may house a package with more dice than prior art techniques. The number of sets of FSB contacts is compatible with the number of FSB signal groups on chipsets that are used to interface with the processors.

Figure 1:
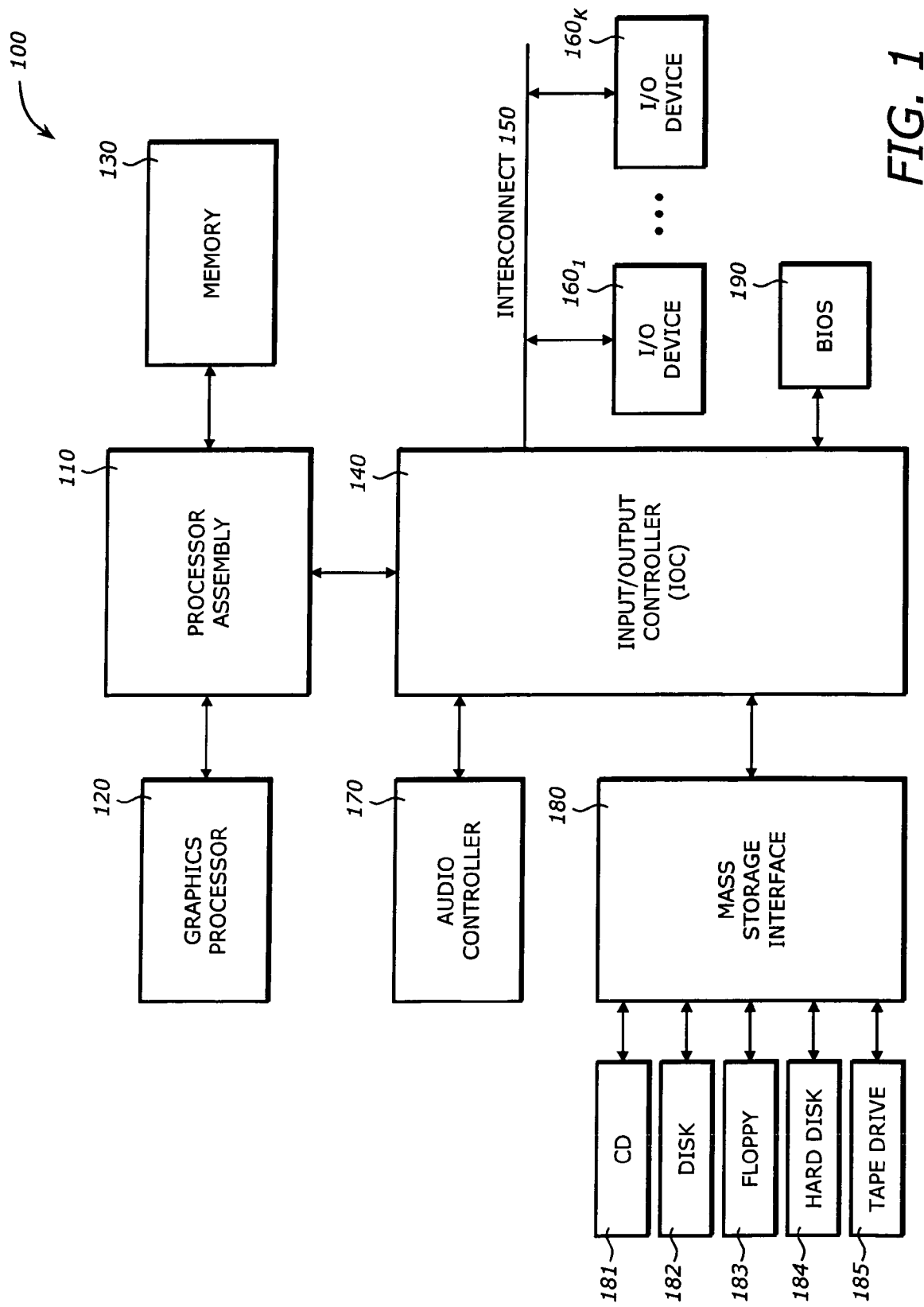
FIG. 1 is a diagram illustrating a system in which one embodiment of the invention can be practiced.

FIG. 1 is a diagram illustrating a system 100 in which one embodiment of the invention can be practiced. The system 100 includes a processor assembly 110, a graphics processor 120, a memory 130, an input/output controller (IOC) 140, an interconnect 150, an audio controller 170, a mass storage interface 180, and a basic input/output system (BIOS) 190.

The processor assembly 110 is an assembly of one or more processors or processor units and one or more chipsets. It may represent a multi-core system, a multiprocessor system with a single chipset or a multiprocessor system with multiple chipsets. The processor unit or processors may be embodied in a die or dice. The die in the processor assembly 110 may represent a central processing unit of any type of architecture, such as processors using hyper threading, security, network, digital media technologies, single-core processors, multicore processors, embedded processors, mobile processors, micro-controllers, digital signal processors, superscalar computers, vector processors, single instruction multiple data (SIMD) computers, complex instruction set computers (CISC), reduced instruction set computers (RISC), very long instruction word (VLIW), or hybrid architecture. The chipset in the processor assembly 110 may be a memory controller (MC) or a chipset having multiple integrated functionalities. The chipset may provide control and configuration of memory and input/output devices such as the graphics processor 120, the memory 130, and the IOC 140. The multiple functionalities in the chipset may include functionalities such as graphics, media, isolated execution mode, host-to-peripheral bus interface, memory control, power management, etc. The memory controller functionality in the chipset may be integrated in the processor or the die. In some embodiments, the memory controller, either internal or external to the processor, may work for all cores or processors in the processor unit. In other embodiments, it may include different portions that may work separately for different cores or processors in the processor unit.

The graphics processor 120 is any processor that provides graphics functionalities. The graphics processor 120 may also be integrated into the chipset in the processor assembly 110 to form a Graphics and Memory Controller (GMC). The graphics processor 120 may be a graphics card such as the Graphics Performance Accelerator (AGP) card, interfaced to the chipset via a graphics port such as the Accelerated Graphics Port (AGP) or a peripheral component interconnect (PCI) Express interconnect. The graphics processor 120 provides interface to a display monitor such as standard progressive scan monitor, television (TV)-out device, and Transition Minimized Differential Signaling (TMDS) controller. The display monitor may be any display device such as Cathode Ray Tube (CRT) monitor, TV set, Liquid Crystal Display (LCD), Flat Panel, and Digital CRT.

The memory 130 stores system code and data. The memory 130 is typically implemented with dynamic random access memory (DRAM), static random access memory (SRAM), or any other types of memories including those that do not need to be refreshed. The memory 130 may include multiple channels of memory devices such as DRAMs. The DRAMs may include Double Data Rate (DDR2) devices with a bandwidth of 8.5 Gigabyte per second (GB/s).

The IOC 140 has a number of functionalities that are designed to support I/O functions. The IOC 140 may also be integrated into a chipset together or separate from the chipset in the processor assembly 110 to perform I/O functions. The IOC 140 may include a number of interface and I/O functions such as peripheral component interconnect (PCI) bus interface, processor interface, interrupt controller, direct memory access (DMA) controller, power management logic, timer, system management bus (SMBus), universal serial bus (USB) interface, mass storage interface, low pin count (LPC) interface, wireless interconnect, direct media interface (DMI), etc.

The interconnect 150 provides interface to peripheral devices. The interconnect 150 may be point-to-point or connected to multiple devices. For clarity, not all interconnects are shown. It is contemplated that the interconnect 150 may include any interconnect or bus such as Peripheral Component Interconnect (PCI), PCI Express, Universal Serial Bus (USB), Small Computer System Interface (SCSI), serial SCSI, and Direct Media Interface (DMI), etc. The interconnect 150 provides interface to I/O devices $160_1$ to $160_K$. The I/O devices $160_1$ to $160_K$ may include any I/O devices to perform I/O functions. Examples of I/O devices $160_1$ to $160_K$ include controller for input devices (e.g., keyboard, mouse, trackball, pointing device), media card (e.g., audio, video, graphic), network card, and any other peripheral controllers.

The audio processor 170 may include any audio device such as microphone, speakers, amplifiers, digital-to-analog converters, analog-to-digital converter, audio codec. It may include high definition audio devices.

The mass storage interface 180 interfaces to mass storage devices to store archive information such as code, programs, files, data, and applications. The mass storage interface 180 may include SCSI, serial SCSI, Advanced Technology Attachment (ATA) (parallel and/or serial), Integrated Drive Electronics (IDE), enhanced IDE, ATA Packet Interface (ATAPI), etc. The mass storage device may include compact disk (CD) read-only memory (ROM) 181, digital video/versatile disc (DVD) 182, floppy drive 183, hard drive 184, tape drive 185, and any other magnetic or optic storage devices. The mass storage device provides a mechanism to read machine-accessible media.

The BIOS 190 may include program or code for booting up the system. It may be implemented in non-volatile memory such as read only memory (ROM), programmable ROM, or flash memory. The BIOS 190 may include security features such as isolated execution mode, cryptographic operations. It may include functionalities such as initializing various components in the system (e.g., mass storage 180, I/O devices $160_1$ to $160_K$), testing memory devices, and loading the operating system (OS), etc.

Figure 2:
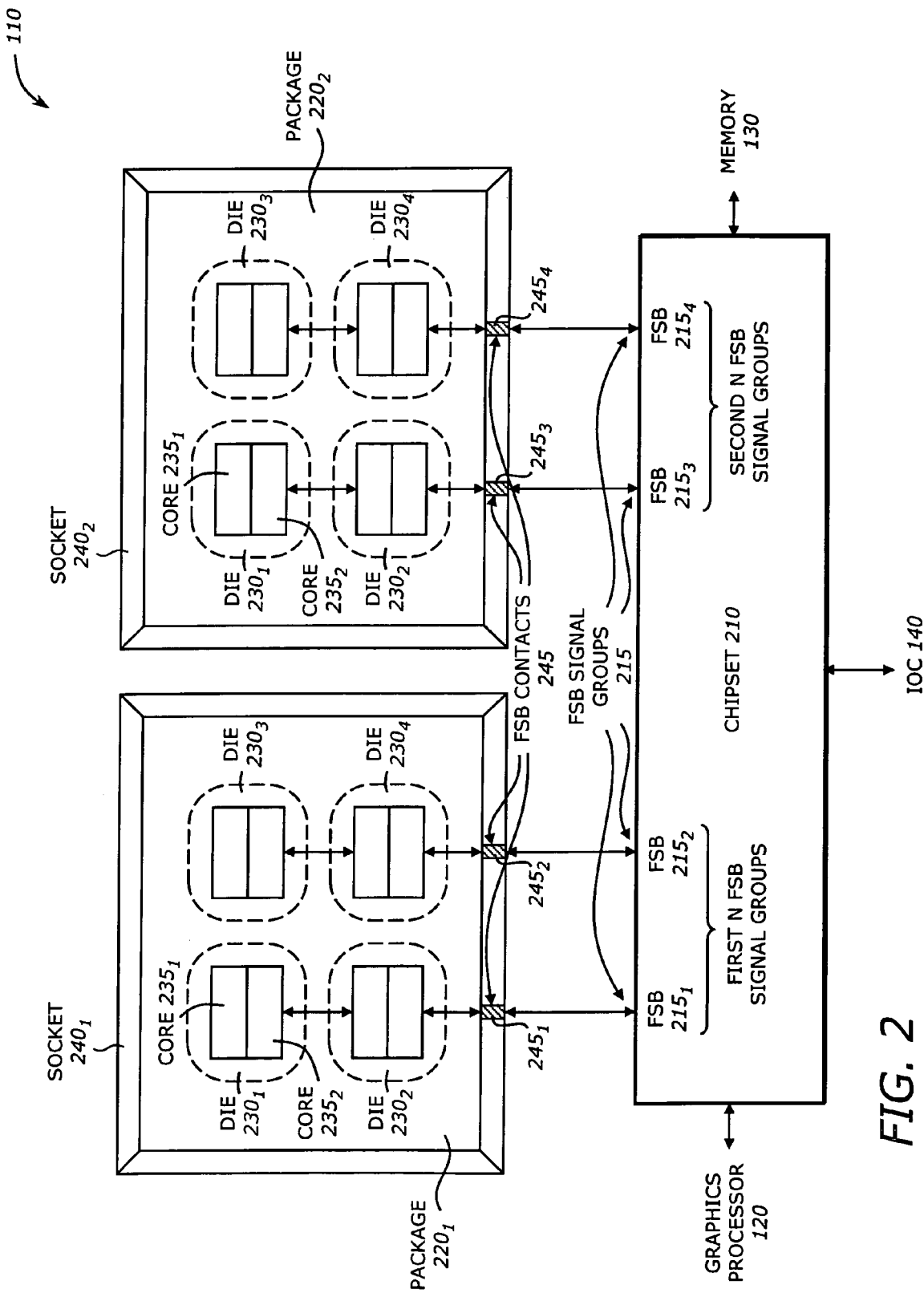
FIG. 2 is a diagram illustrating a processor assembly with a single chipset according to one embodiment of the invention.

FIG. 2 is a diagram illustrating the processor assembly 110 shown in FIG. 1 with a single chipset according to one embodiment of the invention. The processor assembly 110 includes a chipset 210 and two packages $220_1$ and $220_2$.

The chipset 210 may be a memory controller or an integrated controller having multiple functionalities including a memory controller and a graphics processor. The chipset 210 interfaces to the graphics processor 120, if needed, the memory 130, and the IOC 140 shown in FIG. 1.

The chipset 210 has 2N front side bus (FSB) signal groups, where N is a positive integer. In the following, for illustrative purposes, N is equal to 2. The chipset 210 has 4 FSB signal groups $215_1$, $215_2$, $215_3$, and $215_4$. The 4 FSB signal groups may be divided into two groups. The first group includes the FSB signal groups $215_1$ and $215_2$ and the second group includes the FSB signal groups $215_3$ and $215_4$. The FSB is the electrical interface between the chipset 210 and a processor in the packages $220_1$ and $220_2$. It may be referred to as the processor bus or system bus. The FSB includes signals that carry memory, I/O transactions, and interrupt messages. In one embodiment, the FSB is implemented using Gunning Transceiver Logic (GTL), GTL Plus (GTLP or GTL+), or Assisted GTL (AGTL). The FSB may use a source synchronous transfer (SST) of address and data. The FSB may transfer data 4 times per bus clock and address 2 times per bus clock. The clock frequency of the FSB is related to the core frequency of the processors in the packages by a frequency ratio that may range from 1/15 to 1/25. For example, the bus clock frequency may range from 100 MHz to 133 MHz, and the core frequency may range from 2 GHz to 3.2 GHz. The signals on the FSB may include clock inputs, address, data, address strobes, data strobes, control, power and ground, test, etc. In one embodiment, the FSB supports 64-bit data bus.

Each of the packages $220_1$ and $220_2$ includes a number of processors or dice. In one embodiment, each of the packages $220_1$ and $220_2$ includes 2N dice. For illustrative purposes, each package is shown to have 4 dice $230_1$ to $230_4$. For clarity, the same reference numerals $230_1$ to $230_4$ are used for the dice in both packages. Each die represents a processor. In one embodiment, each processor is a multi-core processor having M cores. For illustrative purposes, each die is shown to have two cores (M=2) $235_1$ and $235_2$. For clarity, the same reference numerals $235_1$ and $235_2$ are used for all cores in the dice. Although it may be referred to as a dual-core die, it is understood that an M-core die may be employed, where M may be any positive integer. The 2N dice in each package are divided into two groups. The dice in each group may be joined inside the package using joined-at-bump technology. Each group is interfaced to a FSB signal group.

The packages $220_1$ and $220_2$ are installed or housed in sockets $240_1$ and $240_2$, respectively. Each of the sockets $240_1$ and $240_2$ has N sets of contacts, or pin-outs that are matched to the FSB signal groups, referred to as N sets of FSB contacts. In one embodiment, N=2. Each group of dice in a package is connected to a FSB signal group on the chipset 210 via a set of FSB pint-outs on the corresponding socket. The socket $240_1$ has two sets of FSB contacts $245_1$ and $245_2$. The socket $240_2$ has two sets of FSB contacts $245_3$ and $245_4$.

The chipset 210 is interfaced to the package $220_1$ having 2N dice housed in the socket $230_1$ via the N sets of FSB contacts of the socket $230_1$ using the first N FSB signal groups of the 2N FSB signal groups. Similarly, the chipset 210 is interfaced to the package $220_2$ having 2N dice housed in the socket $230_2$ via the N sets of FSB contacts of the socket $230_2$ using the second N FSB signal groups of the 2N FSB signal groups. As illustrated in FIG. 2, the dice $230_1$ and $230_2$ of the package $220_1$ have their FSB signals connected to the FSB signal group $215_1$ on the chipset 210 via the FSB contact set $245_1$. The dice $230_3$ and $230_4$ of the package $220_1$ have their FSB signals connected to the FSB signal group $215_2$ on the chipset 210 via the FSB contact set $245_2$. The dice $230_1$ and $230_2$ of the package $220_2$ have their FSB signals connected to the FSB signal group $215_3$ on the chipset 210 via the FSB contact set $245_3$. The dice $230_3$ and $230_4$ of the package $220_2$ have their FSB signals connected to the FSB signal group $215_4$ on the chipset 210 via the FSB contact set $245_4$.

By having two sets of FSB contacts on each of the sockets $240_1$ and $240_2$, the processor assembly 110 may support 8 dice/16 cores for the system 100, for N=2. The performance gain may be doubled compared to systems using sockets that house only 2 dice and have one set of FSB contacts. Since the number of dice in each package is doubled, efficient thermal management on the sockets $240_1$ and $240_2$ may be employed. This may include having more efficient heat sinks or reducing processor clock frequency. Even if the processor frequency is reduced, the performance enhancement due to doubling the number of dice is significant. In addition, the packages $220_1$ and $220_2$ may be implemented without mix of silicon technology, resulting in low risk manufacturing.

Figure 3:
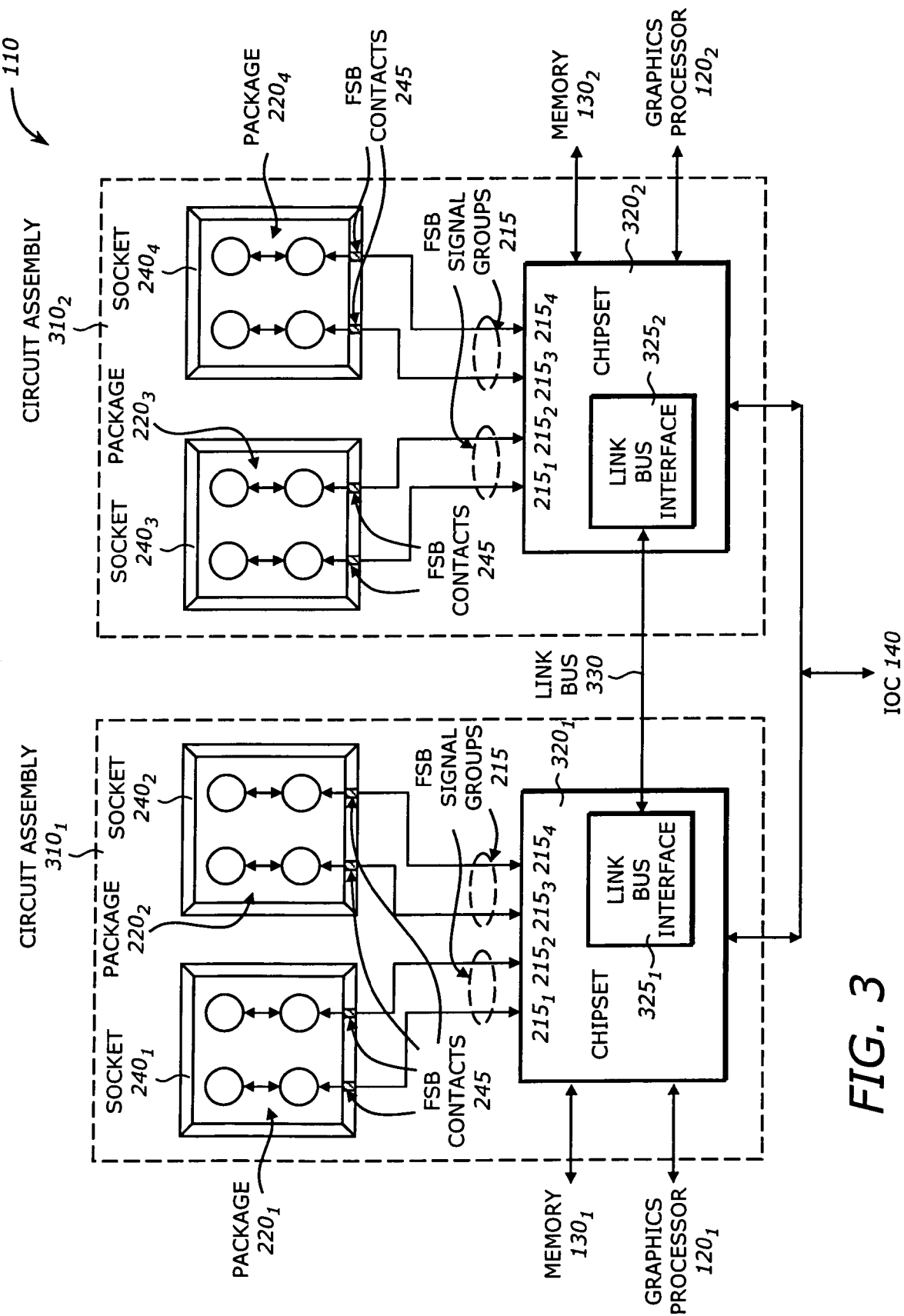
FIG. 3 is a diagram illustrating a processor assembly with multiple chipsets according to one embodiment of the invention.

FIG. 3 is a diagram illustrating a processor assembly 110 with multiple chipsets according to one embodiment of the invention. The processor assembly 110 may include a number of circuit assemblies. For illustrative purposes, only two circuit assemblies $310_1$ and $310_2$ are shown. It is contemplated that more than two circuit assemblies may be employed.

Each of the circuit assemblies $310_1$ and $310_2$ is similar to the processor assembly 110 shown in FIG. 2. Therefore, many details are not repeated. The circuit assembly $310_1$ includes a chipset $320_1$ and two sockets $240_1$ and $240_2$. The two sockets house the packages $220_1$ and $220_2$, respectively. The chipset $320_1$ is similar to the chipset 210 shown in FIG. 2 except that it includes a link bus interface $325_1$. Similarly, the circuit assembly $310_2$ includes a chipset $320_2$ and two sockets $240_3$ and $240_4$. The two sockets house the packages $220_3$ and $220_4$, respectively. The chipset $320_2$ is similar to the chipset 210 shown in FIG. 2 except that it includes a link bus interface $325_2$. The chipsets $320_1$ and $320_2$ are essentially similar. Each of the link bus interfaces $325_1$ and $325_2$ provides interface to support communication between the two chipsets via a link bus 330. Additional link bus interfaces may be included in each of the chipsets $320_1$ and $320_2$ if more than two circuit assemblies are used in the processor assembly 110 to support multiprocessor communication interface. The link bus 330 may be any multiprocessor or multi-core bus. Examples of the link bus 330 may be the Common System Interconnect (CSI) bus, Scalability Protocol (SP) bus, and Full Buffer Dual-In-Line Memory (DIMM) (FBD) bus.

Figure 4:
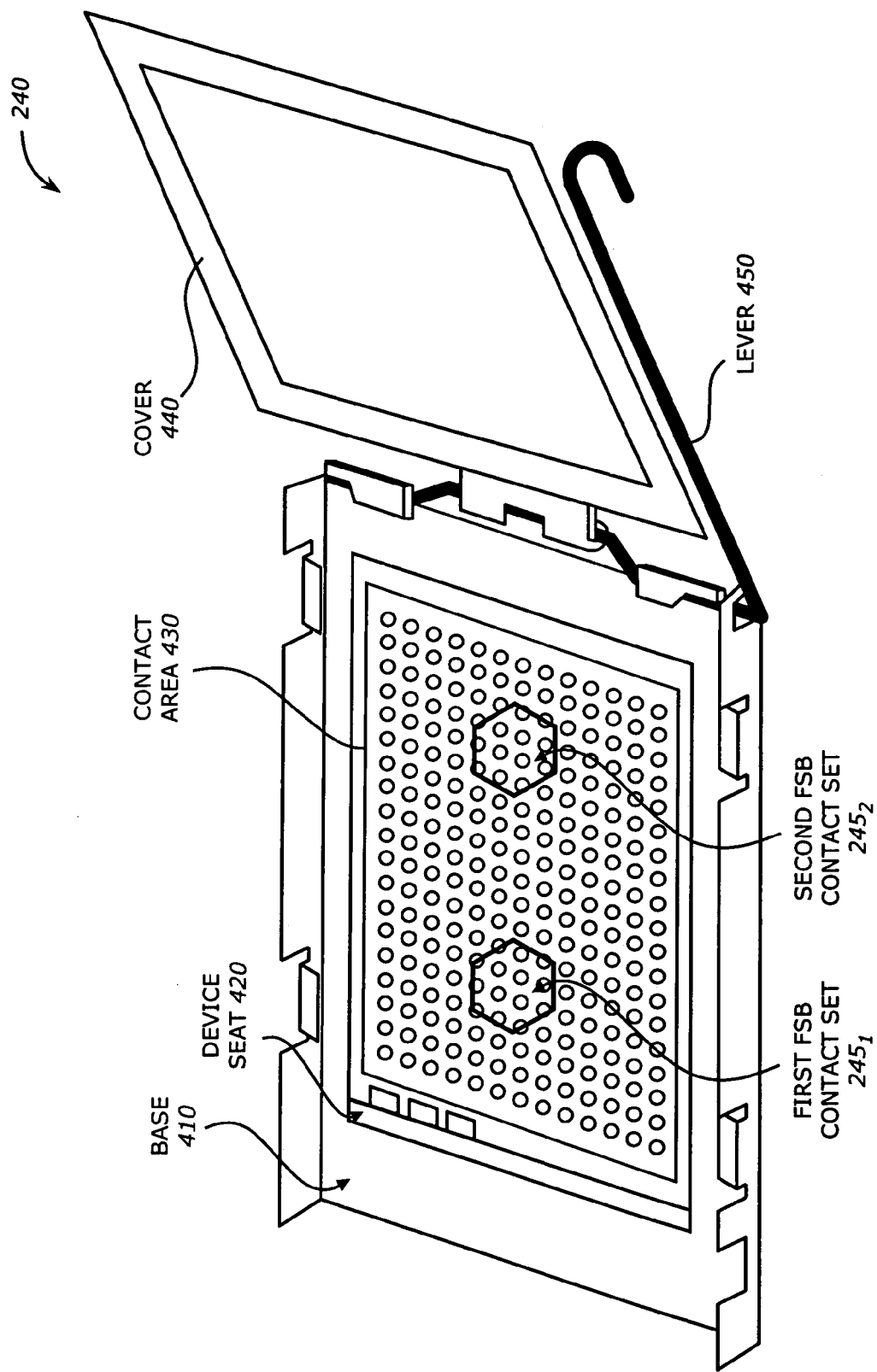
FIG. 4 is a diagram illustrating a socket having multiple front side bus contacts according to one embodiment of the invention.

FIG. 4 is a diagram illustrating the socket 240 shown in FIGS. 2 and 3 having multiple front side bus contacts according to one embodiment of the invention. The socket 240 includes a base 410, a device seat 420, a contact area 430, a cover 440, and a lever 450.

The socket 240 may support dice packaged in one of a Land Grid Array (LGA) package, a Pin Grid Array (PGA) package, a micro PGA package, a Ball Grid Array (BGA) package, and a surface mount package. FIG. 4 is merely for illustrative purposes. The exact design or configuration of the socket 240 depends on the applications, system considerations (e.g., thermal management, package size, package type).

The base 410 provides mechanical support for the housing that houses the package 220 (shown in FIG. 2). It has interface contact points at the bottom to face the interfacing component, such as a printed circuit board (PCB). The bottom contact points are soldered or attached to the PCB to interface to the FSB signal groups 215 of the chipset 210 as shown in FIG. 2.

The device seat 420 is a recessed area that provides a seat for the package 220. The contact area 430 is within the device seat 420 and has a number of contacts or pin-outs. In particular, it includes a first FSB contact set $245_1$ and a second FSB contact set $245_2$ that are connected to two FSB signal groups $215_1$ and $215_2$, or $215_3$ and $215_4$. The first and second FSB signal groups may contain the FSB signals as discussed above.

The lever 450 has a vertical portion and a horizontal portion. It has closed and open positions. At the closed position, the vertical portion of lever 450 is pressed down horizontally, causing the cover 440 to stay flat on the device seat 420 and the contact area 430 and effectively covers the package installed in the device seat 420. At the open position, the vertical portion of the lever 450 is moved up causing the cover 440 to rotate pivotably with respect to the horizontal part of the level 440. Locking slots or guiding slots are available to secure or guide the lever 450.

Figure 5:
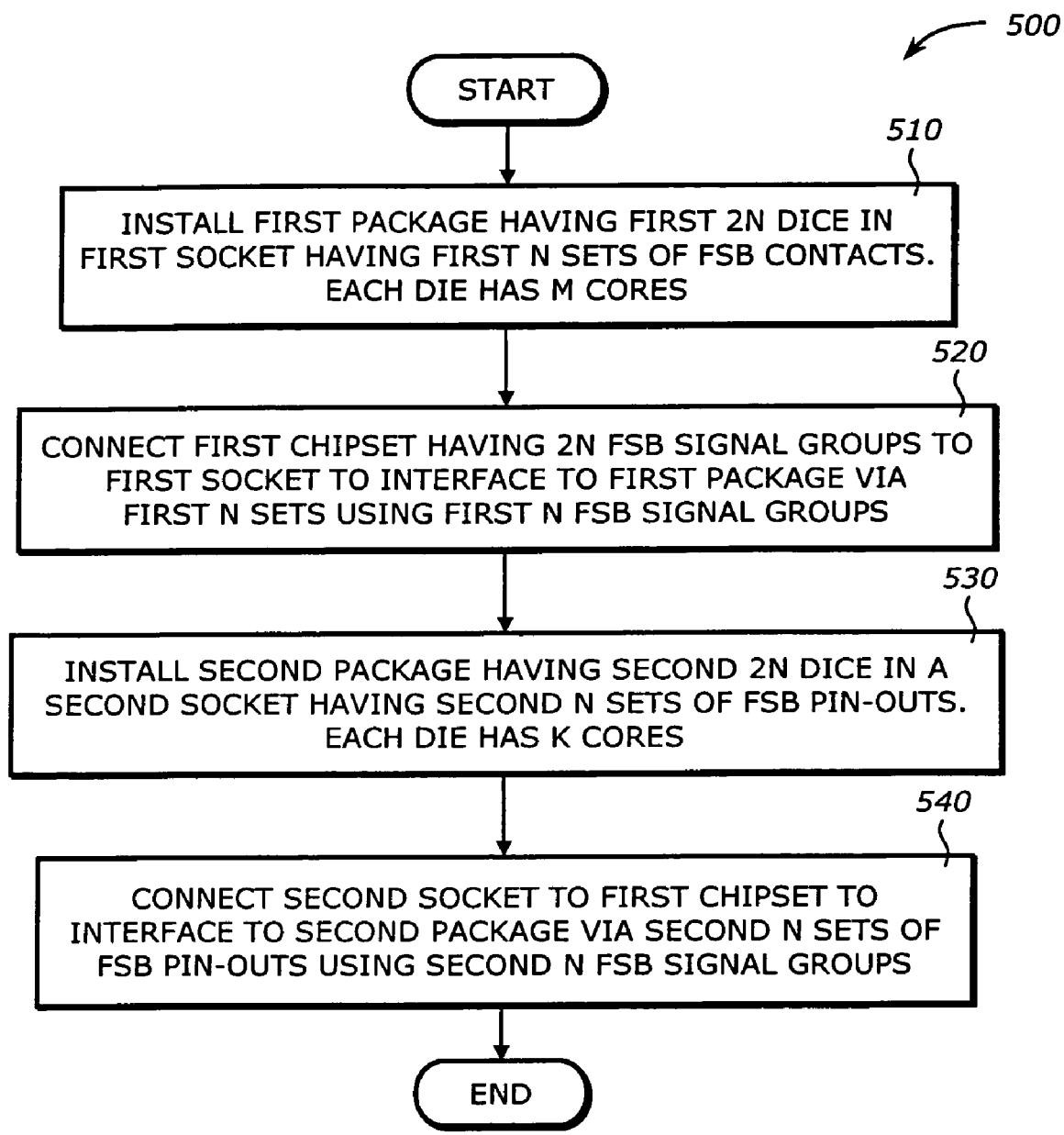
FIG. 5 is a flowchart illustrating a process to assemble a processor assembly with a single chipset according to one embodiment of the invention.

FIG. 5 is a flowchart illustrating a process 500 to assemble a processor assembly with a single chipset according to one embodiment of the invention.

Upon START, the process 500 installs first package having first 2N dice in a first socket having first N sets of front side bus (FSB) contacts (Block 510). Each of the first 2N dice has M cores. N and M are positive integers. In one embodiment, N=M=2. Next, the process 500 connects a first chipset having 2N FSB signal groups to the first socket to interface to the first package via the first N sets of FSB contacts using first N FSB signal group of the 2N FSB signal groups (Block 520).

Then, the process 500 installs second package having second 2N dice in a second socket having second N sets of FSB contacts (Block 530). Each of the second 2N dice has K cores where K is a positive integer. In one embodiment, K=2. Next, the process 500 connects the second socket to the first chipset to interface to second package via the second N sets of FSB contacts using second N FSB signal groups of the 2N FSB signal groups (Block 540). The process 500 is then terminated.

Figure 6:
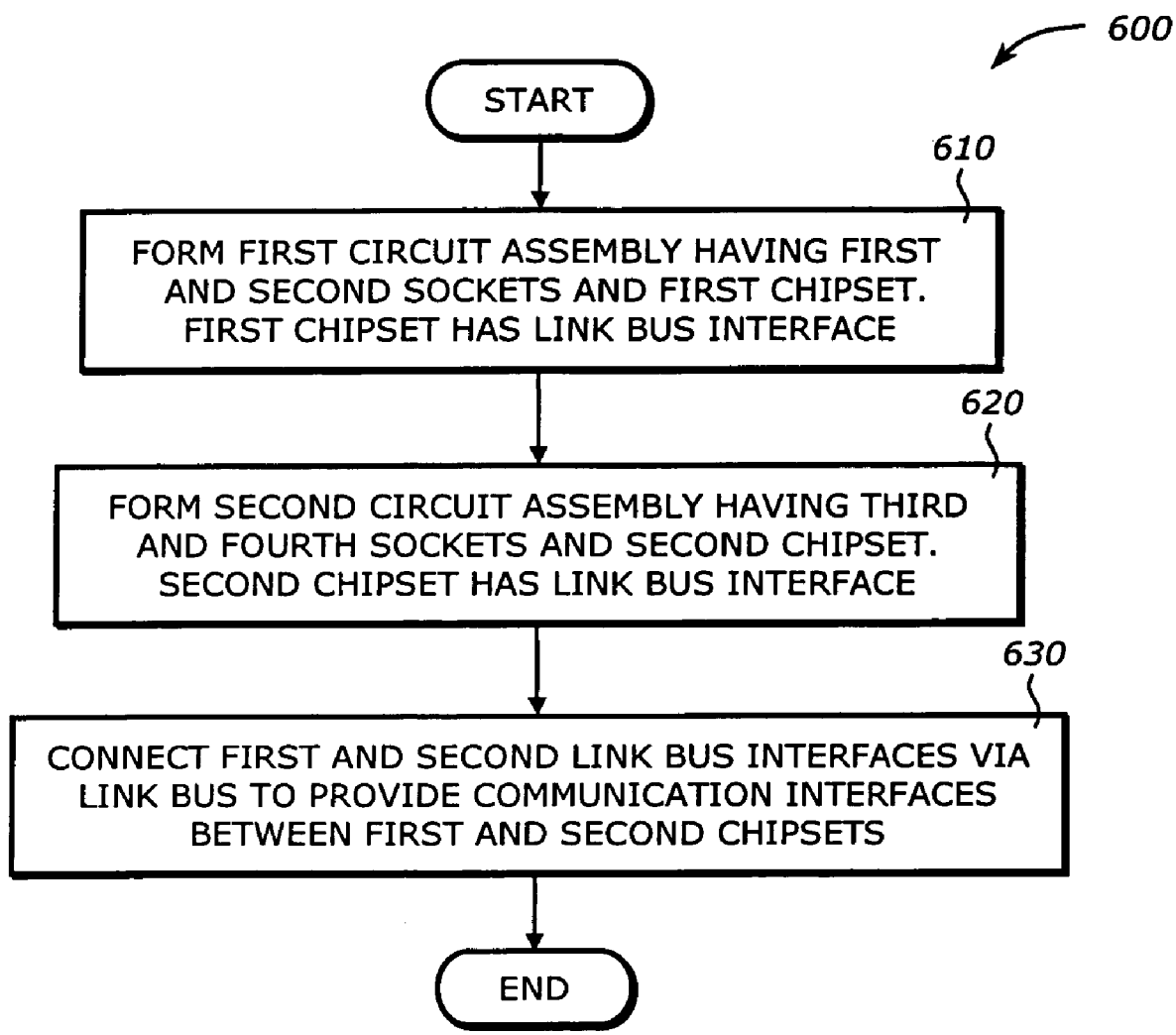
FIG. 6 is a flowchart illustrating a process to assemble a processor assembly with multiple chipsets according to one embodiment of the invention.

FIG. 6 is a flowchart illustrating a process 600 to assemble a processor assembly with multiple chipsets according to one embodiment of the invention.

Upon START, the process 600 forms a first circuit assembly having first and second sockets and a first chipset (Block 610). This may be accomplished using a process similar to the process 500 shown in FIG. 5. Each of the first and second sockets has N sets of FSB contacts and 2N dice. The first chipset has a first link bus interface. Then, the process 600 forms a second circuit assembly having third and fourth sockets and a second chipset (Block 620). This may be accomplished using a process similar to the process 500 shown in FIG. 5. Each of the third and fourth sockets has N sets of FSB contacts and 2N dice. The second chipset has a second link bus interface.

Next, the process 600 connects the first link interface to the second link interface via a link bus to provide communication interface between the first and second chipsets (Block 630). The link bus may be any multiprocessor bus. The process 600 is then terminated.

While the invention has been described in terms of several embodiments, those of ordinary skill in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
 a first socket having first N sets of front side bus (FSB) contacts to house a first package having first 2N dice, each of the first 2N dice having M cores, N and M being positive integers;
 a first chipset having 2N FSB signal groups coupled to the first socket to interface to the first package via the first N sets of FSB contacts using first N FSB signal groups of the 2N FSB signal groups, the first chipset comprising:
  a first link interface coupled to a second link interface of a second chipset via a link bus to provide communication interface between the first and second chipsets; and
 a second socket having second N sets of FSB contacts to house a second package having second 2N dice, each of the second 2N dice having K cores, K being a positive integer, the second socket being coupled to the first chipset to interface the second package to the first chipset via the second N sets of FSB contacts using second N FSB signal groups of the 2N FSB signal groups.

2. The apparatus of claim 1 wherein N=2.

3. The method of claim 1 wherein M=K=2.

4. The method of claim 1 wherein at least of the first and second sockets supports dice packaged in one of a Land Grid Array (LGA) package, a Pin Grid Array (PGA) package, a micro PGA package, a Ball Grid Array (BGA) package, and a surface mount package.

5. The apparatus of claim 1, wherein the FSB is an electrical interface between (i) the first chipset and a first processor in the first package and (ii) the first chipset and a second processor in the second package.

6. The apparatus of claim 5, wherein the FSB is implemented using at least one of: Gunning Transceiver Logic (GTL), GTL Plus, and Assisted GTL (AGTL).

7. The apparatus of claim 5, wherein the FSB uses a source synchronous transfer (SST) of address and data.

8. The apparatus of claim 5, wherein the FSB supports 64-bit data bus.

9. The apparatus of claim 5, wherein clock frequency of the FSB is related to core frequency of the first and second processors.

10. The apparatus of claim 5, wherein clock frequency of the FSB is related to core frequency of the first and second processors by a frequency ratio ranging from 1/15 to 1/25.

11. A method for assembling multi-core dice using sockets with multiple sets of front side bus contacts, comprising:
 installing a first package having first 2N dice in a first socket having first N sets of front side bus (FSB) contacts, each of the first 2N dice having M cores, N and M being positive integers;
 connecting a first chipset having 2N FSB signal groups to the first socket to interface to the first package via the first N sets of FSB contacts using first N FSB signal group of the 2N FSB signal groups;
 installing a second package having second 2N dice in a second socket having second N sets of FSB contacts, each of the second 2N dice having K cores, K being a positive integer; and
 connecting the second socket to the first chipset to interface the package to the first chipset via the second N sets of FSB contacts using second N FSB signal groups of the 2N FSB signal groups; and
 connecting a first link interface of the first chipset to a second link interface of a second chipset via a link bus to provide communication interface between the first and second chipsets.

12. The method of claim 11 wherein N=2.

13. The method of claim 11 wherein M=K=2.

14. The method of claim 11 wherein at least of the first and second sockets supports dice packaged in one of a Land Grid Array (LGA) package, a Pin Grid Array (PGA) package, a micro PGA package, a Ball Grid Array (BGA) package, and a surface mount package.

15. A system comprising:
 a first circuit assembly comprising:
  a first socket having first N sets of front side bus (FSB) contacts to house a first package having first 2N dice, each of the first 2N dice having M cores, N and M being positive integers,
  a second socket having second N sets of FSB contacts to house a second package having second 2N dice, each of the second 2N dice having K cores, K being a positive integers, and
 a first chipset having first 2N FSB signal groups coupled to the first and second sockets to interface to the first package via the first N sets of FSB contacts using first N FSB signal groups of the first 2N FSB signal groups and to the second package via the second N sets of FSB contacts using second N FSB signal groups of the first 2N FSB signal groups, wherein the first chipset comprises a first link bus interface for multiprocessing communication, the first link bus interface coupled to a second link bus interface of a second chipset via a link bus to provide communication interface between the first and second chipsets.

16. The system of claim 15 further comprising:
 a second circuit assembly coupled to the first circuit assembly, comprising:
  a third socket having third N sets of FSB contacts to house a third package having third 2N dice, each of the third 2N dice having L cores, L being a positive integer,
  a fourth socket having fourth N sets of FSB contacts to house a fourth package having fourth 2N dice, each of the fourth 2N dice having P cores, P being a positive integers, and
  the second chipset having second 2N FSB signal groups coupled to the third and fourth sockets to interface to the third package via the third N sets of FSB contacts using first N FSB signal groups of the second 2N FSB signal groups and to the fourth package via the fourth N sets of FSB contacts using second N FSB signal groups of the second 2N FSB signal groups, the second chipset having the second link bus interface connecting to the first link bus interface via the link bus for communication between the first and second chipsets.

17. The system of claim 15 wherein N=2.

18. The system of claim 15 wherein M=K=2.

19. The system of claim 15, wherein the FSB is an electrical interface between (i) the first chipset and a first processor in the first package and (ii) the first chipset and a second processor in the second package.

20. The system of claim 15, wherein the FSB is implemented using at least one of: Gunning Transceiver Logic (GTL), GTL Plus, and Assisted GTL (AGTL).

21. The system of claim 15, wherein clock frequency of the FSB is related to core frequency of the first and second processors.

22. The system of claim 15, wherein the clock frequency of the FSB is related to the core frequency of the first and second processors by a frequency ratio ranging from 1/15 to 1/25.

23. The system of claim 16 wherein L=P=2.

24. The system of claim 16 wherein at least of the first, second, third, and fourth sockets supports dice packaged in one of a Land Grid Array (LGA) package, a Pin Grid Array (PGA) package, a micro PGA package, a Ball Grid Array (BGA) package, and a surface mount package.

* * * * *

UNITED STATES PATENT AND TRADEMARK OFFICE
CERTIFICATE OF CORRECTION

PATENT NO. : 7,602,616 B2  Page 1 of 1
APPLICATION NO. : 11/385134
DATED : October 13, 2009
INVENTOR(S) : Richard Zhao It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 665 days.

Signed and Sealed this

Fifth Day of October, 2010

David J. Kappos
*Director of the United States Patent and Trademark Office*